United States Patent [19]
Jaouen et al.

[11] Patent Number: 6,081,030
[45] Date of Patent: Jun. 27, 2000

[54] SEMICONDUCTOR DEVICE HAVING SEPARATED EXCHANGE MEANS

[75] Inventors: Hervé Jaouen, Meylan; Michel Marty, Varces, both of France

[73] Assignee: STMicroelectronics S.A., Gentilly, France

[21] Appl. No.: 09/105,355

[22] Filed: Jun. 26, 1998

[30] Foreign Application Priority Data

Jun. 27, 1997 [FR] France .................................. 97 08147

[51] Int. Cl.$^7$ .................................................. H01L 23/34
[52] U.S. Cl. .......................... 257/728; 257/724; 257/778; 257/777; 257/531
[58] Field of Search .......................... 257/678, 530–532, 257/778, 777, 728, 724

[56] References Cited

U.S. PATENT DOCUMENTS

| | | | |
|---|---|---|---|
| 3,893,156 | 7/1975 | Riseman | 257/778 |
| 5,311,402 | 5/1994 | Kobayashi et al. | 257/686 |
| 5,519,582 | 5/1996 | Matsuzaki | 361/783 |
| 5,578,874 | 11/1996 | Kurogi et al. | 257/778 |
| 5,659,952 | 8/1997 | Kovac et al. | 29/840 |
| 5,677,575 | 10/1997 | Maeta et al. | 257/778 |
| 5,721,451 | 2/1998 | Settles et al. | 257/679 |
| 5,726,501 | 3/1998 | Matsubara | 257/778 |
| 5,726,502 | 3/1998 | Beddingfield | 257/797 |
| 5,777,383 | 7/1998 | Stager et al. | 257/693 |
| 5,804,882 | 9/1998 | Tsukagoshi et al. | 257/783 |
| 5,825,092 | 10/1998 | Delgado et al. | 257/778 |
| 5,828,128 | 10/1998 | Higashiguchi et al. | 257/738 |
| 5,874,782 | 2/1999 | Palagonia | 257/778 |

FOREIGN PATENT DOCUMENTS

| 3760622 | 4/1990 | France . |
|---|---|---|
| WO9616378 | 5/1996 | France . |

OTHER PUBLICATIONS

Patent Abstracts of Japan—Masahito—Sep. 27, 1996.
Patent Abstracts of Japan—Shigeo—Jul. 22, 1981.
French Search Report.

*Primary Examiner*—Alexander Oscar Williams
*Attorney, Agent, or Firm*—Theodore E. Galanthay; Fleit, Kain, Gibbons, Gutman & Bongini P.L.

[57] ABSTRACT

A semiconductor device having separated exchange mechanism comprises a chip forming an integrated circuit; a connection substrate; device connection points or balls; and at least one exchange mechanism. The connection substrate comprises an external connection mechanism. The device connection points or balls are distributed in the form of a matrix and are located between the juxtaposed faces of the chip and of the connection substrate. The device connection points are connected to the external connection mechanism. The exchange mechanism comprises two parts. The two parts are arranged so as to be separated from each other and capable of exchanging signals between each other, in one or both directions. The first part is physically coupled to the chip. The second part is physically coupled to the connection substrate and is connected to the external connection mechanism.

19 Claims, 1 Drawing Sheet

SEMICONDUCTOR DEVICE HAVING SEPARATED EXCHANGE MEANS

CROSS-REFERENCE TO RELATED APPLICATIONS

This application is based upon and claims the benefit of the priority of the prior French patent application 97 08147 filed on Jun. 27, 1997, the contents of which are incorporated herein.

BACKGROUND OF THE INVENTION

1. Field of the Invention

The present invention relates to the field of microelectronics and more particularly to a semiconductor device which comprises a chip forming an integrated circuit and a connection substrate, in which device connection points or balls distributed in the form of a matrix are provided between the juxtaposed faces of the chip and of the substrate and in which the substrate has external connection means connected to the said connection points.

2. Description of the Related Art

Another U.S. Pat. Application dealing with related technology has been filed on even date herewith. That application, which is entitled "Semiconductor Device having Optoelectronic Remote Signal Exchange Means" by Hervé Jaouen and Michel Marty and is assigned to SGS-Thomson Microelectronics, is application Ser. No. 09/105,735, filed Jun. 26, 1998.

SUMMARY OF THE INVENTION

Briefly, in accordance with the invention, a semiconductor device comprises a chip, a connection substrate, device connection points, and at least one exchange mechanism. The chip comprises a face. The connection substrate comprises an external connection mechanism and a face. The face of the connection substrate is juxtaposed with the face of the chip. The device connection points are distributed in the form of a matrix and are located between the juxtaposed faces of the chip and of the connection substrate. The device connection points are coupled to the external connection mechanism and to the face of the chip. The exchange mechanism comprises two parts. The two parts are arranged so as to be separated from each other and capable of exchanging signals between each other, in one or both directions. The first part is physically coupled to the chip. The second part is physically coupled to the connection substrate and to the external connection mechanism.

Briefly, in accordance with another aspect of the invention, there is provided a method for making the above semiconductor device.

BRIEF DESCRIPTION OF THE DRAWINGS

The present invention will be more clearly understood upon examining a semiconductor device described by way of a non-limiting example and illustrated by the drawings in which.

DETAILED DESCRIPTION OF AN EMBODIMENT

Figure 1:
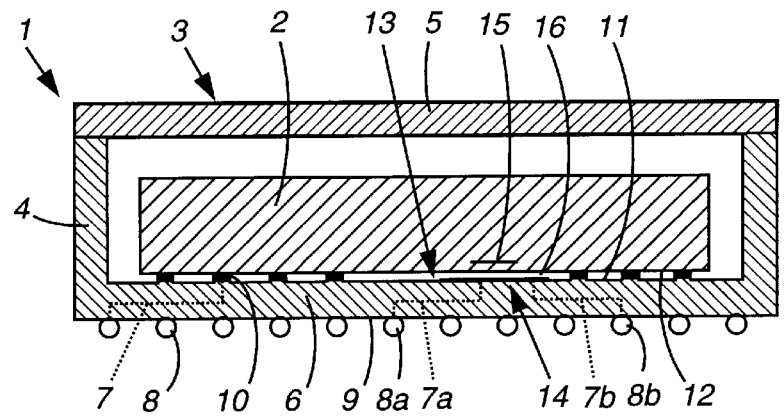
FIG. 1 represents a cross-section of a semiconductor device according to the invention.
Figure 2:
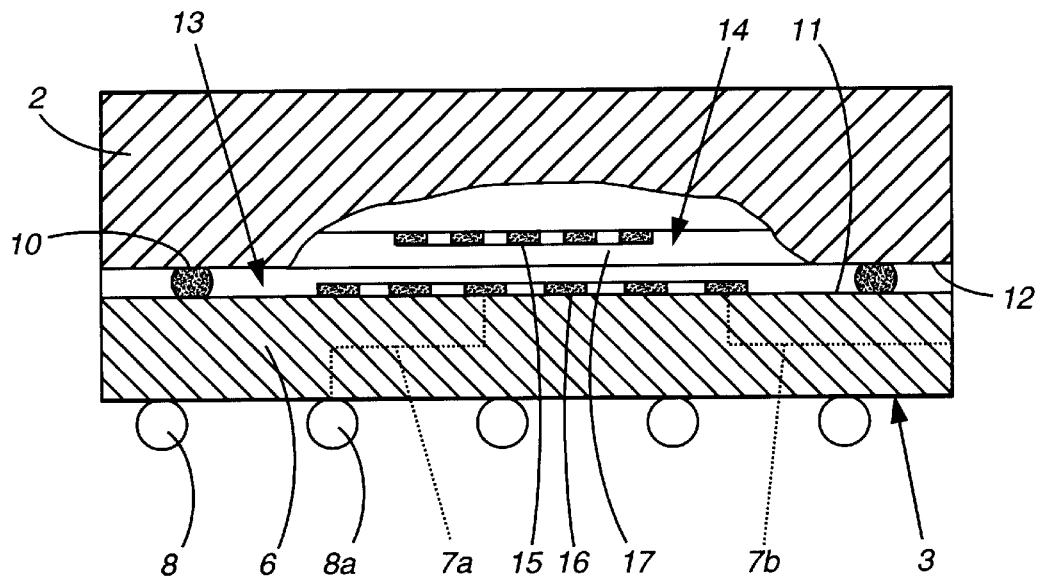
FIG. 2 represents an enlarged section of the central part of the semiconductor device of FIG. 1.
Figure 3:
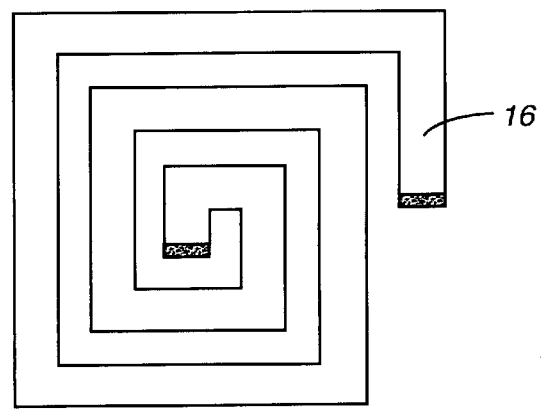
FIG. 3 represents a top view of the substrate of FIG. 1.

Referring to the figures, it may be seen that a semiconductor device, identified in a general manner by the reference 1, has been represented, this device comprising a chip 2 forming an integrated circuit and encapsulated in a package 3 which comprises a holder 4 and a lid 5.

The bottom 6 of the holder 4 consists of a substrate which incorporates a multiplicity of connection lines 7 connecting external connection balls 8, deposited on the external face 9 of the wall 6, to connection balls or points 10 interposed in the space separating the internal face 11 of the wall 6 from the front face 12 of the chip 2, these balls 10 being connected to the integrated circuit in the chip 2.

The external connection balls 8 are distributed in the form of a matrix and the internal connection balls 10 are distributed in the form of a matrix, leaving an approximately central space 13 having no balls.

The density of the placement of the external balls 8 is greater than the density of the placement of the balls 10 so as to make it easier to connect the package, for example to tracks of a printed circuit.

In the region 13 having no balls, the semiconductor device 1 comprises a signal exchange between an inductor 15 having coplanar turns, which is integrated into the chip 2 and which constitutes a component of the integrated circuit in this chip 2, and an inductor 16 having coplanar turns, which is produced by screen printing on the internal face 11 of the wall 6 of the package 3 and which has ends connected to two balls 8a and 8b of the external matrix of balls 8 via connection lines 7a and 7b.

Preferably, the inductor 15 integrated into the chip 2 is produced in the final layer of components or of metallization of this layer and thus lies in the position furthest away from the silicon. In addition, it is covered with a front layer of insulation 17.

Thus, the inductors 15 and 16 are coupled by magnetic induction and form a radiofrequency transformer which makes It possible to exchange signals, in one or both directions, between the integrated circuit in the chip 2 and the outside of the package 3 via the connection balls 8a and 8b.

In a non-limiting illustrative embodiment, the inductor 15 integrated into the chip 2 may have a diameter of between one hundred microns and one millimeter, a thickness of between 0.4 and 2 microns, a number of turns of between 4 and 25, and a distance between turns of between 0.4 and 2 microns.

The inductor 16 screen-printed onto the internal face 11 of the wall 6 of the package 3 may have a diameter of between one and three millimeters, a thickness of between 10 and 100 microns, a number of turns of between four and twenty-five, and a distance between turns of between 1 and 10 microns.

The layer of insulation 17 of the chip 2 may have a thickness of approximately one micron. The space separating the front face 12 of the chip 2 from the internal face 11 of the wall 6 of the package 3 may be approximately one hundred microns.

From the standpoint of its advantages, the signal exchange means 14 formed by the inductors 15 and 16 has no galvanic linkage and thus makes it possible to dispense with at least some of the protection circuits normally integrated into the chip. Furthermore, it allows data input and/or output at very high rates.

In one particular application, the signal exchange means 14 may be used for radiofrequency signal inputs/outputs and may constitute the input circuit of an antenna. Advantageously, it may be used in particular in the field of telephone sets.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. A semiconductor device comprising:

a chip, comprising a face;

a connection substrate comprising an external connection means and a face, wherein the face of the connection substrate is juxtaposed with the face of the chip;

device connection points distributed in the form of a matrix, wherein the device connection points are located between the juxtaposed faces of the chip and of the connection substrate, and wherein the device connection points are coupled to the external connection means and to the face of the chip; and at least one exchange means comprising a first part and a second part, wherein:

the first part is physically coupled to the chip, and the second part is physically coupled to the connection substrate and to the external connection means; and the first part and the second part are arranged so as to be separated from each other and so as to be capable of exchanging signals between each other, in one or both directions, wherein there are no device connection points located between the first part of the at least one exchange means and the second part of the at least one exchange means.

2. The semiconductor device of claim 1, wherein:

the first part and the second part face each other; and the chip comprises an integrated circuit and comprises the first part, such that the first part is integrated into the chip and constitutes a component of the integrated circuit.

3. The semiconductor device of claim 2, wherein:

the first part comprises a first inductor, and the first conductor has coplanar turns;

the second part comprises a second inductor, and the second conductor has coplanar turns; and the first inductor and the second inductor are arranged such that they are separated from and facing each other, so as to be coupled by magnetic induction.

4. The semiconductor device of claim 3, further comprising a layer of material, wherein the material is an electrical insulator, and wherein the layer is located between the first inductor and the second inductor.

5. The semiconductor device of claim 4, wherein the second inductor is screen-printed onto the surface of the substrate which is adjacent to the chip.

6. The semiconductor device of claim 5, wherein the chip comprises the layer of electrical insulating material, and wherein the first inductor is produced, to the rear of the layer, with a final level of metallization.

7. The semiconductor device of claim 6, wherein:

the connection substrate comprises a surface which faces away from the chip; and the external connection means comprises external connection pads distributed in the form of a matrix on the surface of the connection substrate, wherein the external connection pads can serve to electrically connect the semiconductor device to external devices.

8. The semiconductor device of claim 7, further comprising a package which encapsulates the chip, wherein the package comprises the connection substrate.

9. The semiconductor device of claim 4, wherein the chip comprises the layer of electrical insulating material, and wherein the first inductor is produced with a final level of metallization and the first inductor is covered by the layer of electrical insulating material.

10. The semiconductor device of claim 3, wherein the second inductor is screen-printed onto the surface of the substrate which is adjacent to the chip.

11. The semiconductor device of claim 1, wherein the external connection means comprises external connection pads distributed in the form of a matrix on the surface of the connection substrate which is opposite the chip.

12. The semiconductor device of claim 1, further comprising a package for encapsulating the chip, wherein the package comprises the connection substrate.

13. The semiconductor device of claim 11, wherein the external connection means further comprises at least one connection pad which is not part of the matrix distribution and to which the second part of the at least one exchange means is connected.

14. The semiconductor device of claim 1, wherein the first part of the at least one exchange means is not electrically connected to the second part of the at least one exchange means.

15. The semiconductor device of claim 1, wherein:

the first part comprises a first inductor, and the first conductor has coplanar turns;

the second part comprises a second inductor, and the second conductor has coplanar turns; and the first inductor and the second inductor are arranged such that they are separated from and facing each other, so as to be coupled by magnetic induction.

16. A semiconductor device comprising:

a chip, wherein:

the chip comprises a first inductor and an electrical insulator;

the first inductor is physically located behind the electrical insulator; and the first inductor is produced with the final level of metallization;

a connection substrate, wherein:

the substrate comprises an external connection means comprising external connection pads distributed in the form of a matrix on the surface of the connection substrate which is opposite the chip;

the connection substrate is physically oriented, with respect to the chip, such that the electrical insulator is between the connection substrate and the first inductor;

device connection points distributed in the form of a matrix, wherein the device connection points are located between the juxtaposed faces of the chip and of the connection substrate, and the device connection points are connected to the external connection means, and an exchange means comprising the first inductor and a second inductor, wherein:

the second inductor has coplanar turns, is screen-printed onto the surface of the connection substrate which is physically closer to the chip, and is connected to the external connection means;

the first inductor and the second inductor are arranged such that they are separated from and facing each other, so as to be coupled by magnetic induction and capable of exchanging signals between each other, in one or both directions; and there are no device connection points located between the first inductor of the exchange means and the second inductor of the exchange means; and a package for encapsulating the chip, wherein the package comprises the connection substrate.

17. The semiconductor device of claim 16, wherein the first inductor of the exchange means is not electrically connected to the second inductor of the exchange means.

18. A method for making a semiconductor device, the semiconductor device comprising a chip; a connection substrate; device connection points distributed in the form of a matrix and located between the juxtaposed faces of the chip and of the connection substrate; and at least one exchange means comprising a first part and a second part; the method comprising the steps of:

arranging the first part and the second part of the exchange means so that they are separated from each other and are capable of exchanging signals between each other, in one or both directions;

coupling, physically, the first part of the exchange means to the chip;

coupling, physically, the second part of the exchange means to the connection substrate;

coupling, electrically and physically, the chip to the connection substrate, using the device connection points;

providing an electrical interface on the connection substrate for devices external to the semiconductor device;

connecting the second part of the exchange means to the external electrical interface of the connection substrate; and coupling, electrically, the external electrical interface of the connection substrate to the device connection points, wherein there are no device connection points located between the first part of the exchange means and the second part of the exchange means.

19. The method of claim 18, wherein the first part of the exchange means is not electrically connected to the second part of the exchange means.

\* \* \* \* \*